(12) United States Patent
Wada

(10) Patent No.: US 7,983,370 B2
(45) Date of Patent: Jul. 19, 2011

(54) CLOCK AND DATA RECOVERY CIRCUIT

(75) Inventor: Shigeki Wada, Tokyo (JP)

(73) Assignee: NEC Corporation, Tokyo (JP)

( * ) Notice: Subject to any disclaimer, the term of this patent is extended or adjusted under 35 U.S.C. 154(b) by 1031 days.

(21) Appl. No.: 10/582,145

(22) PCT Filed: Nov. 26, 2004

(86) PCT No.: PCT/JP2004/017573
§ 371 (c)(1),
(2), (4) Date: Jun. 7, 2006

(87) PCT Pub. No.: WO2005/057840
PCT Pub. Date: Jun. 23, 2005

(65) Prior Publication Data
US 2007/0121772 A1    May 31, 2007

(30) Foreign Application Priority Data

Dec. 8, 2003 (JP) .................................. 2003-409204

(51) Int. Cl.
*H04L 7/00* (2006.01)
(52) U.S. Cl. ........ 375/355; 327/147; 327/156; 342/103; 375/215; 375/294; 375/327; 375/376; 386/204; 388/911; 455/180.3; 455/260
(58) Field of Classification Search .................. 375/142, 375/375; 331/11
See application file for complete search history.

(56) References Cited

U.S. PATENT DOCUMENTS 5,610,954 A * 3/1997 Miyashita et al. ............ 375/375
5,761,617 A * 6/1998 Yonekura et al. ............ 340/7.32
6,249,160 B1 6/2001 Tagami et al.
(Continued)

FOREIGN PATENT DOCUMENTS

JP          5-327683          12/1993
(Continued)

OTHER PUBLICATIONS

Razavi, Behzad; "Design of Integrated Circuits for Optical Communications"; pp. 296-297; published by McGraw-Hill Higher Education; New York, NY, Sep. 2002.
(Continued)

*Primary Examiner* — Dac V Ha
*Assistant Examiner* — Adolf Dsouza
(74) *Attorney, Agent, or Firm* — Michael Best & Friedrich LLP

(57) ABSTRACT

A clock and data recovery circuit including a phase synchronization loop including an oscillator, the oscillation frequency of which is variably controlled, the phase synchronization loop performing phase-synchronization of a clock signal output from the oscillator with an input data signal. The circuit also includes a discriminator circuit, responsive to a clock signal for discrimination, for discriminating the input data signal and outputting the discriminated signal. The circuit further includes a phase detector circuit for detecting the phase difference between an output data signal, discriminated and output by the discriminator circuit, and the input data signal. The circuit also includes a phase shift circuit for shifting the phase of the clock signal, output from the oscillator, based on a comparison result output from the phase detector circuit. The clock signal, which is output from the phase shift circuit, is supplied as the clock signal for discrimination to the discriminator circuit.

7 Claims, 12 Drawing Sheets

U.S. PATENT DOCUMENTS

| | | | |
|---|---|---|---|
| 6,566,967 B1 * | 5/2003 | Anumula et al. | 331/11 |
| 2004/0207437 A1 | 10/2004 | Shibahara et al. | |

FOREIGN PATENT DOCUMENTS

| | | |
|---|---|---|
| JP | 9-148922 | 6/1997 |
| JP | 2000-216763 | 8/2000 |
| JP | 2000-228660 | 8/2000 |
| JP | 2001-127626 | 5/2001 |
| JP | 2001-156630 | 6/2001 |
| JP | 2001-345793 | 12/2001 |
| JP | 2004-235842 | 8/2004 |

OTHER PUBLICATIONS

International Search Report, International Patent Application No. PCT/JP2004/017573, mailed Mar. 8, 2005.

International Preliminary Report on Patentability, International Patent Application No. PCT/JP2004/017573, issued Jul. 27, 2006. (English translation).

* cited by examiner

FIG. 5A CASE OF PHASE LEAD OF RECEIVED DATA SIGNAL
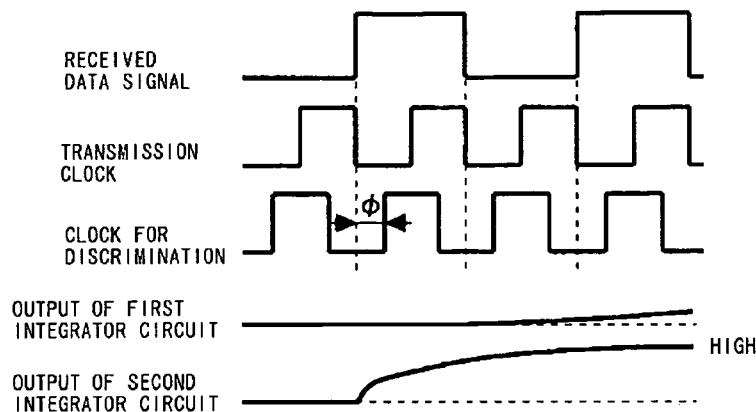
FIG. 5B CASE OF PHASE LAG OF RECEIVED DATA SIGNAL
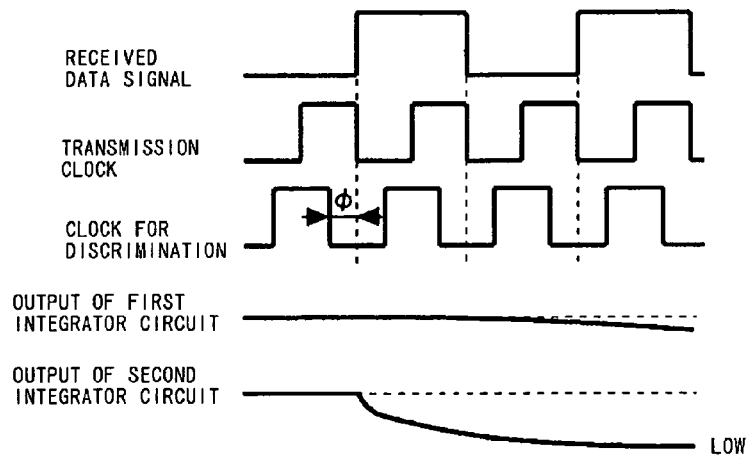
FIG. 5C CASE OF SYNCHRONIZATION OF RECEIVED DATA SIGNAL WITH CLOCK FOR DISCRIMINATION
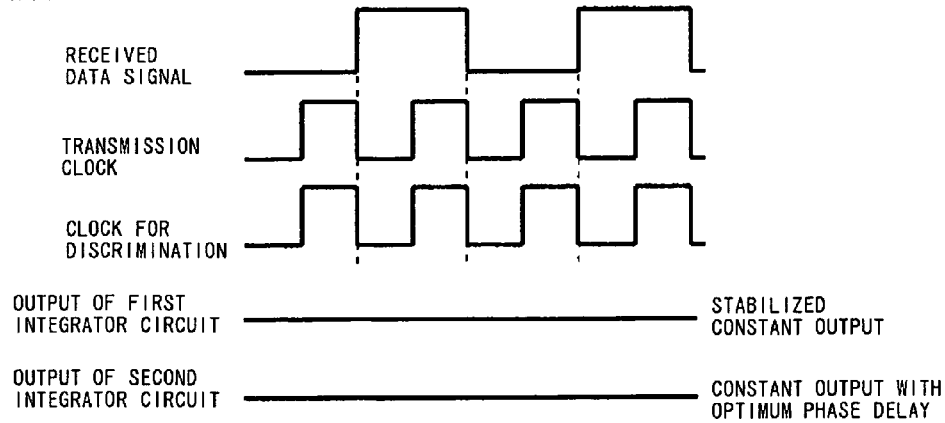

PHASE SHIFTER

CASE OF SHORT TIME CONSTANT OF LPF

CASE OF LONG TIME CONSTANT OF LPF

CASE OF LONG TIME CONSTANT OF LPF1 AND SHORT TIME CONSTANT OF LPF2

CASE OF PHASE LEAD OF CLOCK SIGNAL FOR DISCRIMINATION

CASE OF PHASE LAG OF CLOCK SIGNAL FOR DISCRIMINATION

CASE OF SYNCHRONIZATION OF CLOCK SIGNAL FOR DISCRIMINATION

CASE OF LONG TIME CONSTANT OF INTEGRATING CIRCUIT (LPF)

CASE OF SHORT TIME CONSTANT OF INTEGRATING CIRCUIT (LPF)

CLOCK AND DATA RECOVERY CIRCUIT

This application claims the benefit of International Patent Application No. PCT/JP2004/017573, filed Nov. 26, 2004, which claims priority of Japanese Patent Application No. 2003-409204, filed Dec. 8, 2003.

FIELD OF THE INVENTION

This invention relates to a clock and data recovery circuit for recovering the clock for discrimination from a data signal for discriminating and recovering an input data signal.

BACKGROUND OF THE INVENTION

A conventional clock and data recovery circuit of this type will now be described. FIG. 8 is a diagram showing the configuration of a clock and data recovery circuit of the type disclosed in Patent Publication 1 as indicated below. Referring to FIG. 8, this clock and data recovery circuit includes a phase detector 602 for comparing the phase of two input signals to output the result of comparison, an integrator circuit 603 for integrating a signal representing the result of phase comparison, and a voltage-controlled oscillator 604, abbreviated to VCO, for varying the oscillation frequency based on an output voltage from the integrator circuit 603. These circuit components make up a feedback loop (feedback closed path) 601. The integrator circuit 603 is composed by a low-pass filter and may also be termed a 'loop filter circuit', which may also be abbreviated to 'LPF'.

An output signal of the VCO 604 is fed back to one input end of the phase detector 602. To the other input of the phase detector 602 is supplied an input data signal (Data In).

In the clock and data recovery circuit, there is provided a discriminator 605 for discriminating and recovering the input data signal. The discriminator 605 is composed by, for example, a D-type flip-flop (edge-triggered register) which samples the input data signal (Data In), supplied to a data input terminal, with a rising or fall edge of a discriminating clock signal, supplied to a clock input end, to output the sampled result as an output data signal (Data Out) at a data output terminal. The discriminator 605 is also termed a 'D-FF', a 're-timer' or a 'decision circuit'. The discriminator 605 receives, at its clock input terminal, an output clock signal (Clock Out; clock for discrimination) from the VCO 604, and is synchronized with the output clock signal from the VCO 604. The integrator circuit 603 has a sufficiently long time constant as compared with the clock period of the transmission data signal.

The operation of a conventional clock and data recovery circuit, shown in FIG. 8, will now be described.

FIG. 9 is a diagram showing phase comparison characteristics of the phase detector 602 of FIG. 8. In FIG. 9, the phase difference and an output of the phase detector are plotted on the horizontal axis and on the vertical axis, respectively. The clock period of the transmission data signal is assumed to be $2\pi$. If the phase difference $\phi$ between the input data signal (Data In) and the clock for discrimination (CLOCK OUT), as an output of the VCO 604, is such that $-\pi < \phi < 0$, the phase detector 602 outputs a negative output. If the phase difference $\phi$ is such that $0 < \phi < \pi$, the phase detector 602 outputs a positive output.

If, on the other hand, there is no phase difference between two signals, supplied to two input terminals of the phase detector 602 ($\phi = 0$), the output of the phase detector 602 becomes equal to zero.

The VCO 604 receives the feedback from the output of the phase detector 602 and varies the oscillation frequency in a direction of reducing the phase difference $\phi$ within a range of $-\pi/2 < \phi < \pi/2$, until finally the phase difference $\phi$ is equal to zero in which synchronization is attained.

FIGS. 10A to 10C show the above-described process by timing charts. FIG. 10A shows the timing chart for a case where there is phase lead in the clock for discrimination (=output clock of the VCO 604). The phase detector 602 compares the phase of a change-point of an input data signal in this case with a fall timing of the clock for discrimination, and outputs a negative value corresponding to the phase difference. The integrator circuit 603 integrates an output of the phase detector 602 with a time constant which is long enough as compared with the period of the data signal for transmission. Hence, the output gradually transitions to a low level. An output of the integrator circuit 603 is supplied as a control voltage signal to the VCO 604 to lower the oscillation frequency. By this feedback configuration, the phase difference $\phi$ is decreased in a direction in which the change-point of input data is ultimately coincident with the fall timing of the clock for discrimination.

FIG. 10B shows the timing chart for a case where there is phase lag in the clock for discrimination (=output clock of VCO 604). The phase detector 602 outputs a positive value, as before, so that the output of the integrator circuit 603 gradually transitions to a high level. This raises the oscillation frequency of the VCO 604, with the phase difference $\phi$ decreasing in a direction in which the change-point of the input data is ultimately coincident with the fall timing of the clock for discrimination.

FIG. 10C shows the timing chart for a synchronized state where the change-point of the input data signal has become coincident with the fall timing of the clock for discrimination. In this case, the phase detector 602 and the integrator circuit 603 both output zero, and the oscillation frequency of the VCO 604 then is fixed. Thus, the change-point of the input data is kept at all times coincident with the fall timing of the clock for discrimination.

The conventional clock data recovering device, described above, converges to a synchronized state in which the change-point of the input data is coincident with the fall timing of the clock for discrimination. Hence, the clock signal (Clock Out), synchronized with the input data signal (Data In), may be recovered.

Also, in the discriminator 605, the data signal may be discriminated and recovered with an optimum phase of discrimination through use of the recovered clock signal (Clock Out).

FIG. 11 is a diagram showing the configuration of a clock and data recovery circuit disclosed in Patent Publication 1, recited hereinbelow. Referring to FIG. 11, the conventional clock and data recovery circuit will now be described. A clock extraction means 901 extracts a change-point signal from a transmission data signal. A phase synchronization means 902 synchronizes the oscillation frequency of a voltage controlled oscillator (VCO) 909 with the transmission data signal, based on the change-point signal. A clock delay means 903 performs phase-comparison between the transmission data signal and the output clock of a variable delay circuit 912, by a phase detector 910, to delay the clock by a certain time period.

In the discriminator 904, the transmission data signal is discriminated and recovered with the clock supplied from the clock delay means 903. By this configuration, the clock may automatically be delayed by a certain time period with respect to the change-point of transmission data signal.

There is also known a phase synchronizing circuit composed of a phase synchronizing loop circuit, a phase shifter, a retiming circuit and a phase shift control circuit (see Patent Publication 2, for example). The phase synchronizing loop circuit outputs a VCO oscillation signal, as a clock signal phase-synchronized with the data input signal (DATA IN), and the phase shifter outputs a clock signal for the data input signal. The retiming circuit has a discriminating/recovering function of outputting an as-retimed discriminated/recovered signal, as retimed data, and outputs a data signal (DATA OUT). The phase shift control circuit receives the extracted clock, generated by the phase synchronizing loop circuit, at its data latch circuit, via the phase shifter, and latches a signal level, using a data input signal, to generate the phase information. The present invention, which will be described subsequently, differs from the configuration of Patent Publication 2 as to e.g. the phase shift control and structure. For example, in one aspect of the present invention, which will be described in detail, the phase difference between the output data signal (DATA OUT) from the discriminator (which samples received data with the output clock signal) and the input data signal (DATA IN) is checked by a phase detector, and the phase of the oscillation signal from the VCO is shifted based on the result of phase comparison. On the other hand, in the configuration described in Patent Publication 2, the phase shift control circuit controls the phase of the phase shifter based on an output value of a latch which latches the input data signal (DATA IN) with an output clock signal.

Non-Patent Publication 1: 'Design of Integrated Circuits for Optical Communications', ISBN0-07-282258-9, pp.297

Patent Publication 1: JP Patent Kokai Publication No. JP-P2000-228660A (page 6, FIG. 6)

Patent Publication 2: JP Patent Kokai Publication No. JP-P2000-216763A (pages 5 and 6, FIG. 1)

DISCLOSURE OF THE INVENTION

Problem to be Solved by the Invention

In the above-described conventional clock and data recovery circuit, the time constant of the integrator circuit needs to be of a sufficiently large value, as compared with the cycle time of the transmission data signal, in order to cope with a succession of the same symbols that may be in the transmission data signal. That is, the response time (time constant) of the integrator circuit needs to be long enough so that, even in the absence of change-points in the transmission data signal, the oscillation frequency of the VCO will not be changed, in order to provide for a stabilized clock control voltage supplied to the VCO.

However, with this configuration, the response time of the output of the integrator circuit with respect to data variations (VCO control signal) is longer, as shown in FIG. 12A. Hence, there is presented a problem that the clock and data recovery circuit cannot quickly follow on fluctuations or variations of the transmission data signal, as shown in FIG. 12B, with the result that it takes considerable time until recovery and output of the correct clock and data get re-started.

If the time constant of the integrator circuit is diminished for shortening the response time, there is presented a problem that variations in the clock control voltage on the occasion of occurrence of a succession of the same symbols tend to be increased, as shown in FIG. 12C, with the result that clock may be out of synchronization, or the phase noise tends to be increased.

The above two problems are in a relationship of tradeoff and cannot be made compatible to each other, that is, they cannot be solved simultaneously.

In the circuit configuration, shown in FIG. 11, the clock may be delayed by a certain preset delay time, so that the clock will be caused to follow on a change-point of a transmission data signal. For operating the discriminator 904 with optimum phase discrimination, an optimum delay time needs to be preset as a circuit constant. However, this delay time is appreciably influenced by the transmission data speed and the circuit configuration, and hence it is difficult to set the circuit constant to an optimum value.

In view of the above depicted state of the art, it is a principal object of the present invention to provide a clock data generating circuit whereby the above-described problem of the response time may be solved and the phase of discrimination may automatically be controlled to an optimum value to render it unnecessary to set the circuit constants.

Means to Solve the Problem

The invention disclosed in the present application which attains the above object, are configured as follows.

A clock and data recovery circuit, in accordance with one aspect of the present invention, includes: a phase synchronization loop including an oscillator, the oscillation frequency of which is variably controlled, said phase synchronization loop performing phase-synchronization of a clock signal output from said oscillator with an input data signal; a discriminator circuit, responsive to a clock signal for discrimination, for discriminating said input data signal and outputting the discriminated signal; a phase detector circuit for detecting the phase difference between an output data signal, discriminated and output by said discriminator circuit, and said input data signal; and a phase shift circuit for shifting the phase of the clock signal, output from said oscillator, based on a comparison result output from said phase detector circuit; wherein the clock signal, output from said phase shift circuit, is supplied as said clock signal for discrimination to said discriminator circuit.

A clock and data recovery circuit in accordance with another aspect of the present invention comprises: a first feedback loop at least including a first phase detector circuit for detecting the phase difference between a clock signal and a received data signal; a second feedback loop including a discriminator circuit supplied with said received data signal, and a second phase detector circuit for detecting the phase difference between the data signal discriminated and output by said discriminator circuit and said received data signal; and a clock recovery circuit for being controlled by said first and second feedback loops to output the clock signal recovered; wherein the clock signal output from said clock recovery circuit is supplied as a clock signal for discrimination by said discriminator circuit.

According to the present invention, the first feedback loop includes: a voltage-controlled oscillator circuit for varying the oscillation frequency based on an input control signal voltage; a first phase detector circuit supplied with a clock signal output from said voltage-controlled oscillator circuit and with said received data signal to detect the phase difference between the two input signals; and a first integrator circuit for integrating an output of said first phase detector circuit and for supplying an output voltage to said voltage-controlled oscillator circuit as a control signal voltage, while said second feedback loop includes: a discriminator circuit supplied with said received data signal; a second phase detector circuit supplied with an output data signal, output from said discriminator circuit, and with said received data signal, to detect the phase difference between the two signals supplied; a second integrator circuit for integrating an output of said second phase detector circuit; and a phase shift circuit receiving said clock signal output from said voltage-controlled oscillator circuit and an integrated output of said second integrator circuit, for shifting the phase of said clock signal in accordance with the integrated output received, to output the resulting clock signal; said clock signal, output from said phase shift circuit, being supplied to said discriminator circuit as a clock for discrimination and output as an output clock signal.

A clock and data recovery circuit in another aspect of the present invention comprises: a first feedback loop including a first phase detector circuit for detecting the phase difference between an input reference clock signal and a recovered clock signal; and a second feedback loop including a discriminator circuit supplied with a received data signal and a second phase detector circuit for detecting the phase difference between the data signal discriminated and output by said discriminator circuit and said received data signal; a clock for discrimination of said discriminator circuit being supplied from a clock recovery circuit controlled by said first and second feedback loops.

According to the present invention, the first feedback loop includes: a voltage-controlled oscillator circuit for varying the oscillation frequency based on an input control signal voltage; a first phase detector circuit receiving the clock signal output from said voltage-controlled oscillator circuit and said reference clock signal to detect the phase difference therebetween, and a first integrator circuit for integrating an output of said first phase detector circuit to supply the resulting output voltage to said voltage-controlled oscillator circuit as a control signal voltage, while said second feedback loop includes: a discriminator circuit supplied with said received data signal; a second phase detector circuit supplied with the data signal output from said discriminator circuit and with said received data signal to detect the phase difference between the two signals supplied; a second integrator circuit for integrating an output of said second phase detector circuit; and a phase shift circuit supplied with said clock signal output from said voltage-controlled oscillator circuit and with an integrated output of said second integrator circuit to phase-shift the input clock signal depending on the input integrated output; the clock signal, output from said phase shift circuit, being supplied to said discriminator circuit as the clock for discrimination, and being output as an output clock signal.

In a clock and data recovery circuit in another aspect of the present invention, the first phase detector circuit includes a selection circuit for selecting the received data signal or the reference clock signal, as a signal to be subjected to phase comparison with the clock signal from the voltage-controlled oscillator.

According to the present invention, the first feedback loop includes: a selection circuit supplied with a reference clock signal and with said received data signal to output one of the signals based on a selection control signal; a voltage-controlled oscillator circuit for varying the oscillation frequency based on an input control signal voltage; a first phase detector circuit supplied with a clock signal output from said voltage-controlled oscillator circuit and with a signal from said selection circuit to detect the phase difference therebetween; and a first integrator circuit for integrating an output of said first phase detector circuit to supply the resulting output voltage as a control signal voltage to said voltage-controlled oscillator circuit, while the second feedback loop includes: a discriminator circuit supplied with said received data signal; a second phase detector circuit supplied with an output of said discriminator circuit and with said received data signal to detect the phase difference therebetween; a second integrator circuit for integrating an output of said second phase detector circuit; and a phase shift circuit supplied with a clock signal output from said voltage-controlled oscillator circuit and with an integrated output of said second integrator circuit to shift the phase of the input clock signal in accordance with said integrated output supplied to output the resulting clock signal; the clock signal output from said phase shift circuit being supplied to said discriminator circuit as a signal for discrimination and being output as an output clock signal.

According to the present invention, the time constant of the first feedback loop may be selected to be larger than the time constant of the second feedback loop. In the clock and data recovery circuit according to the present invention, including a discriminator circuit for discriminating an input data signal responsive to a clock signal for discrimination to output an output data signal, and a clock generating circuit, supplied with the input data signal or with a reference clock signal to generate a clock signal synchronized with the signal supplied, the clock and data recovery circuit may comprise a feedback loop. This feedback loop detects the phase difference between the output data signal and the signal supplied, and phase-shifts the clock signal, based on the result of integration of the phase difference, to supply the resulting clock signal to the discriminator circuit as the clock signal for discrimination.

Meritorious Effect of the Invention

According to the present invention, the first feedback loop, controlling the oscillation frequency of a voltage-controlled oscillator, is dissociated from the second feedback loop for data recovery, so that the clock frequency and the clock phase may be controlled independently from each other.

Thus, according to the present invention, the relationship of trade-off between tracking time and stability at the time of occurrence of a succession of the same symbols may be relaxed appreciably. Hence, the tracking speed to fluctuations or variations in the transmission data signal may be improved without detracting from the high clock quality.

Moreover, according to the present invention, the transmission data signal is compared with the as-discriminated data signal, and the feedback is applied. Hence, adjustment to optimum phase of discrimination may be achieved automatically, without dependency upon transmission data speed or circuit configurations, thereby assuring a sufficiently large phase margin.

BRIEF DESCRIPTION OF THE DRAWINGS

FIGS. 5A to 5C are timing diagrams for illustrating the operation of the embodiments of the present invention.

EXPLANATION OF REFERENCE NUMERALS

Figure 1:
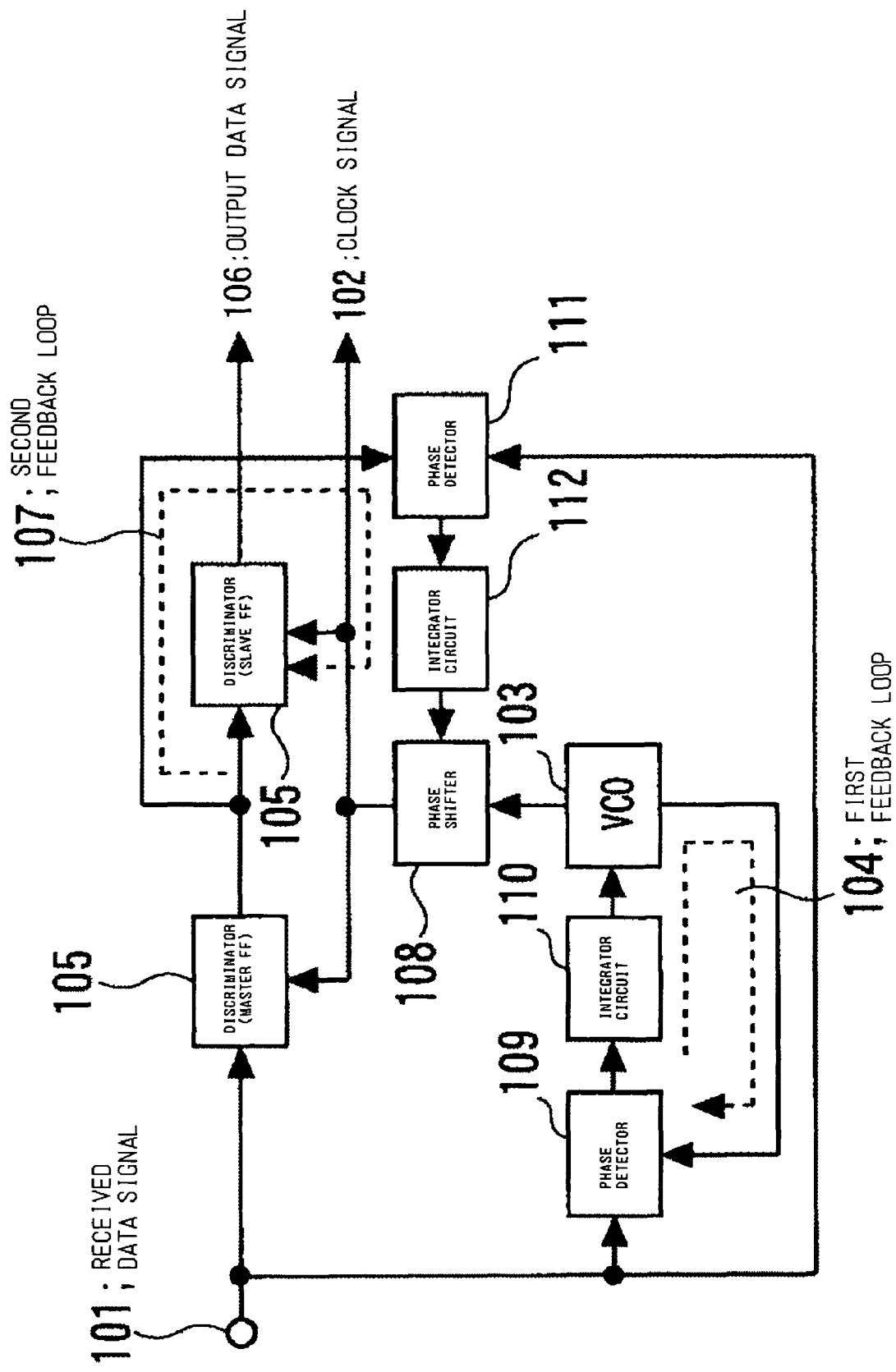
FIG. 1 is a diagram showing the configuration of a first embodiment of the present invention.

11~14 micro-strip lines
15, 16 diodes
101 received data signal
102 clock signal
103 voltage-controlled oscillator (VCO)
104 first feedback loop
105 discriminator (D-FF)
106 output data signal
107 second feedback loop
108 phase shifter
109 first phase detector circuit
110 first integrator circuit (LPF1)
111 second phase detector circuit
112 second integrator circuit (LPF2)
201 received data signal
202 clock signal
203 voltage-controlled oscillator (VCO)
204 first feedback loop
205 discriminator
206 output data signal
207 second feedback loop
208 phase shifter
209 first phase detector circuit
210 first integrator circuit
211 second phase detector circuit
212 second integrator circuit
215 selector control signal
301 received data signal
302 clock signal
303 voltage-controlled oscillator (VCO)
304 first feedback loop
305 discriminator
306 output data signal
307 second feedback loop
308 phase shifter (phase shift circuit)
309 first phase detector circuit
310 first integrator circuit (LPF1)
311 second phase detector circuit
312 second integrator circuit (LPF2)
313 reference clock signal
401 reference clock signal
402 selector
403 selector control terminal
601 feedback loop
602 phase detector
603 integrator circuit
604 voltage-controlled oscillator
605 discriminator
901 clock extracting means
902 phase synchronizing means
903 clock delay means
904 discriminator
909 voltage-controlled oscillator
910 phase detector
912 variable delay circuit
1101 control terminal

BEST MODE FOR CARRYING OUT THE INVENTION

For further detailed description of the present invention, reference is made to the accompanying drawings.

A preferred embodiment of the present invention will now be described. A first embodiment of the present invention includes a first phase detector circuit (209 of FIG. 2) which compares the phase of an input data signal supplied to its first input end with that of a clock signal supplied to its second input end, and outputs the result of comparison at its output end, a first integrator circuit (210 of FIG. 2) which receives and integrates an output signal of the first phase detector circuit (209), and a clock recovery circuit (203) (composed of, for example, a voltage-controlled oscillator) which receives an output signal from the first integrator circuit (210) at its input end and varies the oscillation frequency based on the output signal to output a clock signal at its output end. The clock signal, output from the clock recovery circuit (203), is fed back to the second input end of the first phase detector circuit (209) to constitute a first feedback loop. The first embodiment of the present invention further includes a discriminator circuit (205 of FIG. 2) which is supplied with the received data signal at its data input end and discriminates the received data signal, based on the clock signal for discrimination, supplied to its clock input end, to output a data signal at its output end, a second phase detector circuit (211 of FIG. 2) which compares the phase of the data signal supplied from the discriminator circuit (205) to a first input end, with that of the data signal received at its second input end, to output the result of comparison at its output end and a phase shifter circuit (208 of FIG. 2) which receives, at its input end, a clock signal, output from the clock recovery circuit (203), while receiving an output signal of the second integrator circuit (212) at its control signal input end, to shift the phase of the clock signal, output from the clock recovery circuit (203), based on the output signal, to output the resultant phase-shifted signal at its output end. The output clock signal of the phase shifter (208) is supplied to the discriminator circuit (205), as a clock signal for discrimination and hence the discriminator circuit (205), second phase detector circuit (211), second integrator circuit (212) and the phase shifter (208) constitute a second feedback loop.

According to the present invention, described above, the first feedback loop for controlling the oscillation frequency of the VCO is dissociated from the second feedback loop for data recovery, so that the clock frequency and the clock phase may be controlled separately from each other. The relationship of trade-off between tracking time and stability at the time of occurrence of a succession of the same symbols may be relaxed appreciably. Hence, the tracking speed to fluctuations or variations in the transmission data signal may be improved without detracting from the high clock quality. With the present embodiment, the transmission data signal is compared with the as-discriminated data signal, and the feedback is applied. Hence, adjustment to optimum phase of discrimination may be achieved automatically to assure a sufficiently large amount of phase margin. The following description will be made of certain concrete embodiments.

Embodiments

FIG. 1 is a diagram showing the configuration of a clock and data recovery circuit according of a first embodiment of the present invention. Referring to FIG. 1, the clock and data recovery circuit of the present embodiment includes a first feedback loop 104 which includes a first phase detector circuit 109 for detecting the phase difference between a received data signal 101 and an output signal of a VCO 103, and a second feedback loop 107 which includes a second phase detector circuit 111 for detecting the phase difference between a signal obtained by discriminating the received data signal 101 by a discriminator 105 and the received data signal 101.

The first feedback loop 104 includes the first phase detector 109, a first integrator circuit (low-pass filter) 110 and the voltage-controlled oscillator (VCO) 103.

The second feedback loop 107 includes the second phase detector 111, a second integrator circuit (low-pass filter) 112, a phase shifter 108 and the discriminator 105.

In the present embodiment, the discriminator 105 is composed by an edge trigger register consisting of a two-stage flip-flop (latch), namely a master latch and a slave latch. The master latch receives an input data signal at its data input terminal to hold it for output, when the clock signal supplied to its clock terminal is low. The slave latch receives an output of the master latch to hold it for output when the clock signal is high. The output of the master latch is supplied to the second phase detector circuit 111. The data output from the slave latch becomes an output data signal 106.

Figure 9:
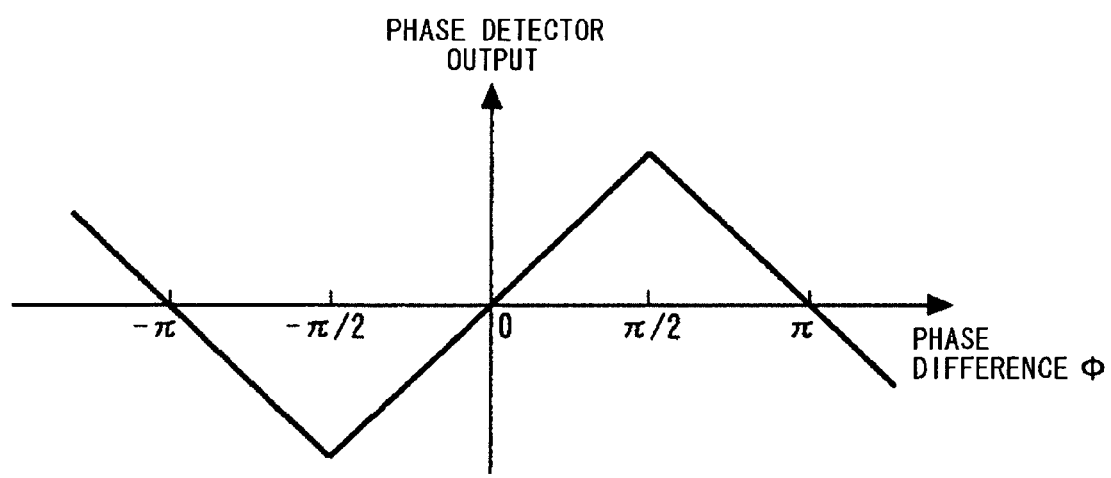
FIG. 9 is a graph showing characteristics of a phase detector.
Figure 10A:
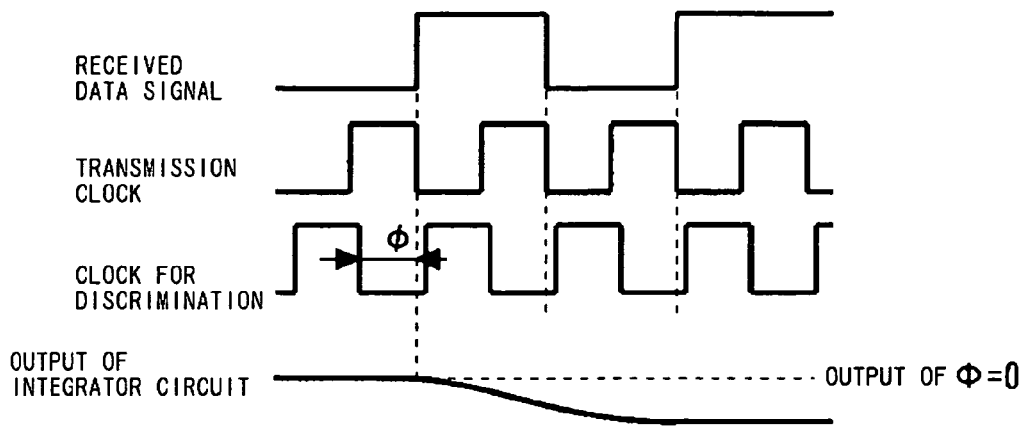
FIG. 10 is a timing chart for illustrating the operation of a conventional clock and data recovery circuit.
Figure 10B:
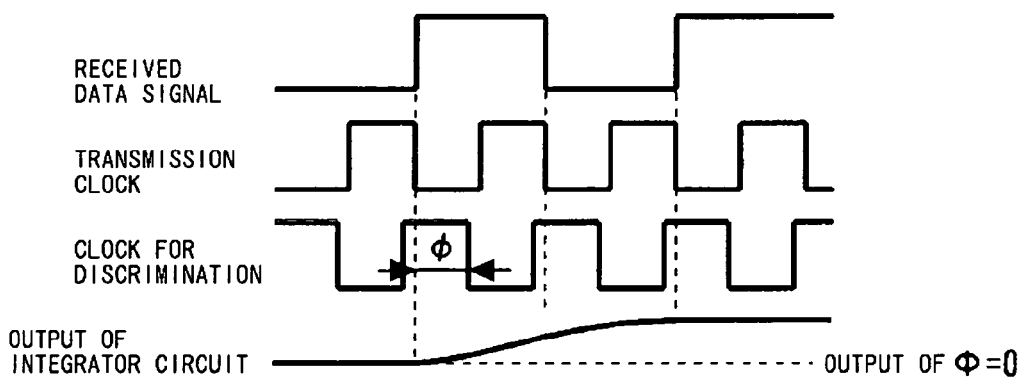
Figure 10C:
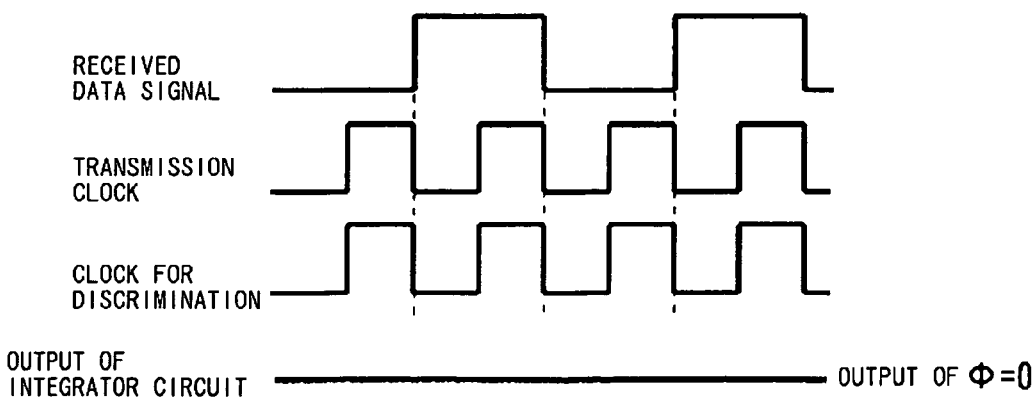
Figure 11:
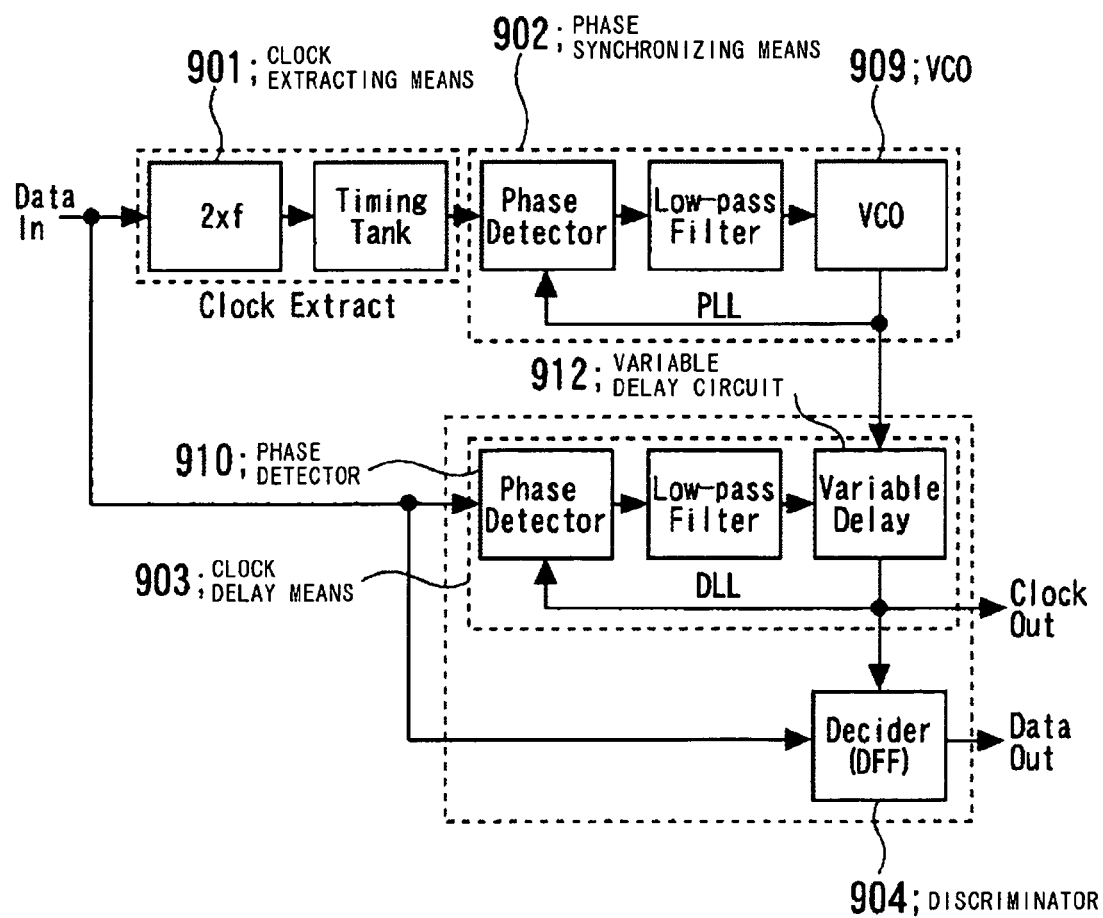
FIG. 11 is a diagram showing the configuration of a conventional clock and data recovery circuit.
Figure 12A:
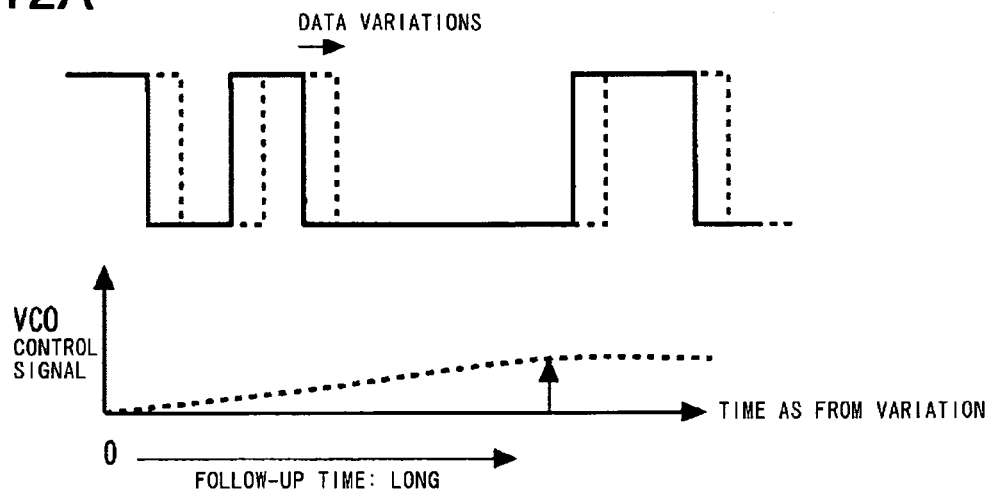
FIG. 12 is a graph showing the relationship between a received data signal and a VCO control signal.
Figure 12B:
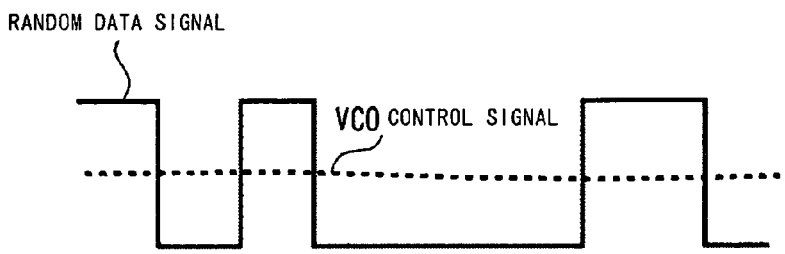
Figure 12C:
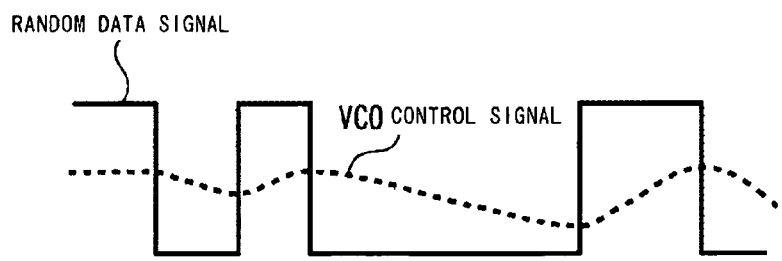

The first and second phase detectors 109 and 111 are each composed by an Ex-OR having a characteristic shown in FIG. 9, as described above.

Figure 6:
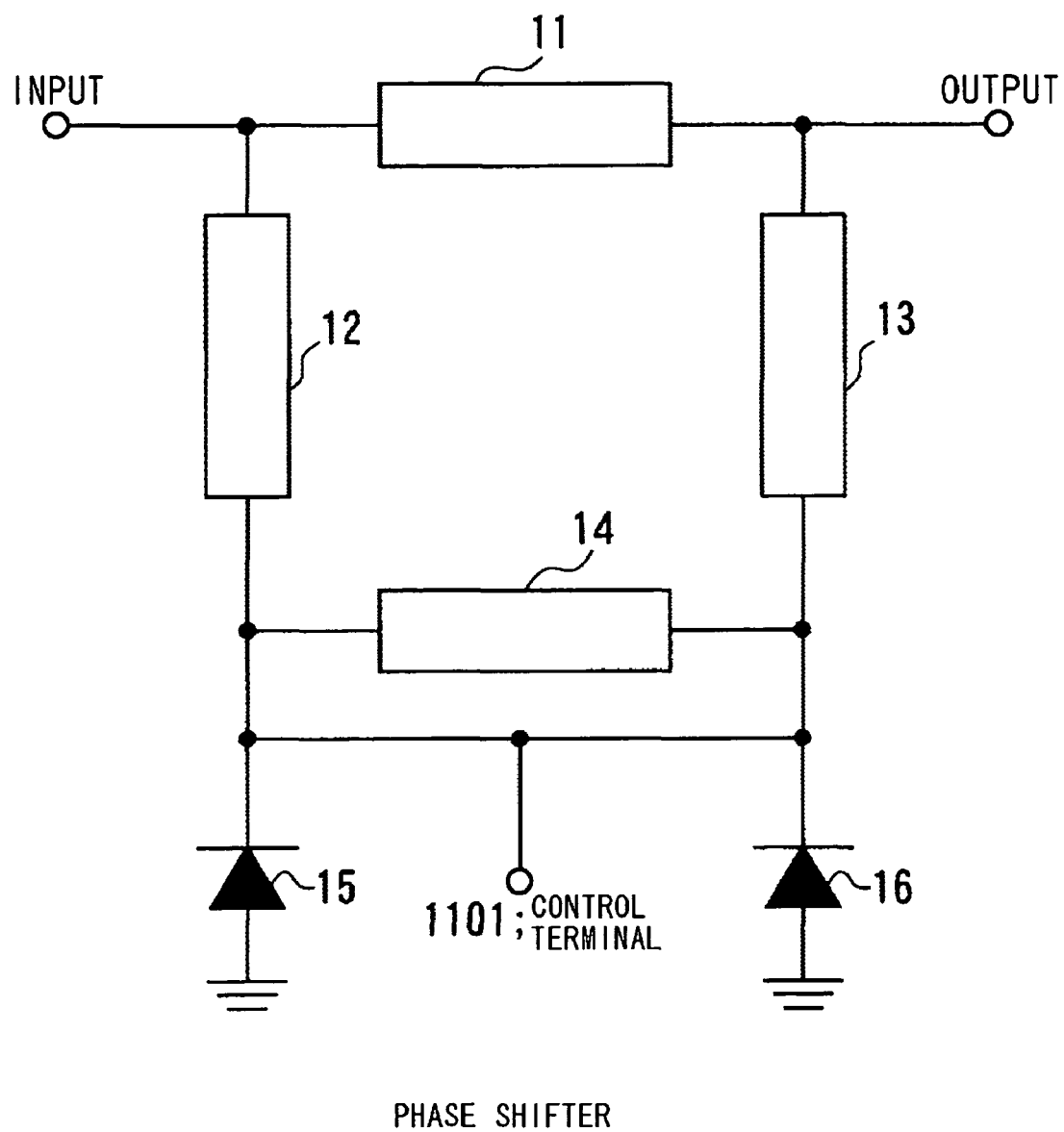
FIG. 6 is a diagram showing an example of the configuration of a phase shifter used in the present invention.

The phase shifter 108 is composed by a reflection-type analog phase shift unit, made up by diodes 15, 16 and microstrip lines 11, 12, 13 and 14, shown for example in FIG. 6. The phase delay is controlled by variably controlling the voltage (cathode terminal voltage of the diodes) with a control terminal 1101.

In the present embodiment, the first feedback loop 104 for controlling the oscillation frequency of the VCO 103 is dissociated from the second feedback loop 107 for data recovery, so that the clock oscillation frequency and the clock phase can be controlled independently of each other.

Figure 7A:
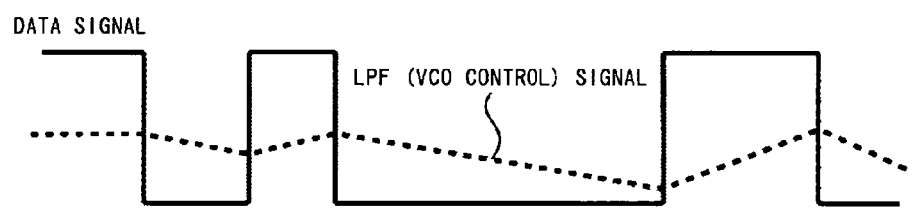
FIGS. 7A and 7C show the relationship between the time constant of an integrator circuit and a VCO control signal for a reference case and that for the present invention, respectively.
Figure 7B:
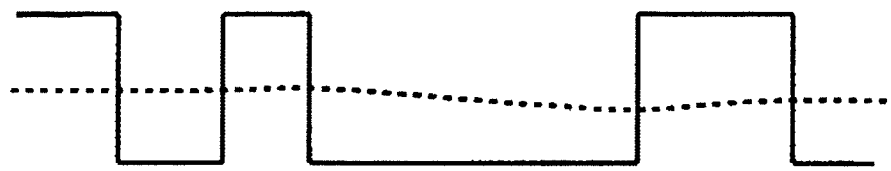
Figure 7C:
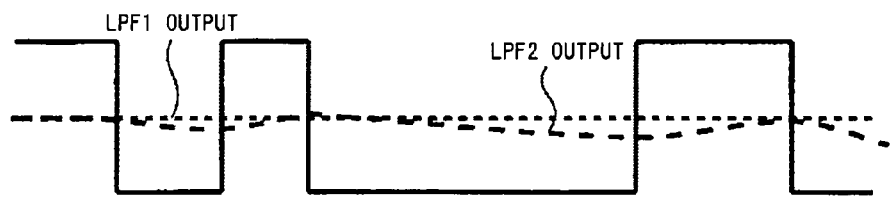
Figure 8:
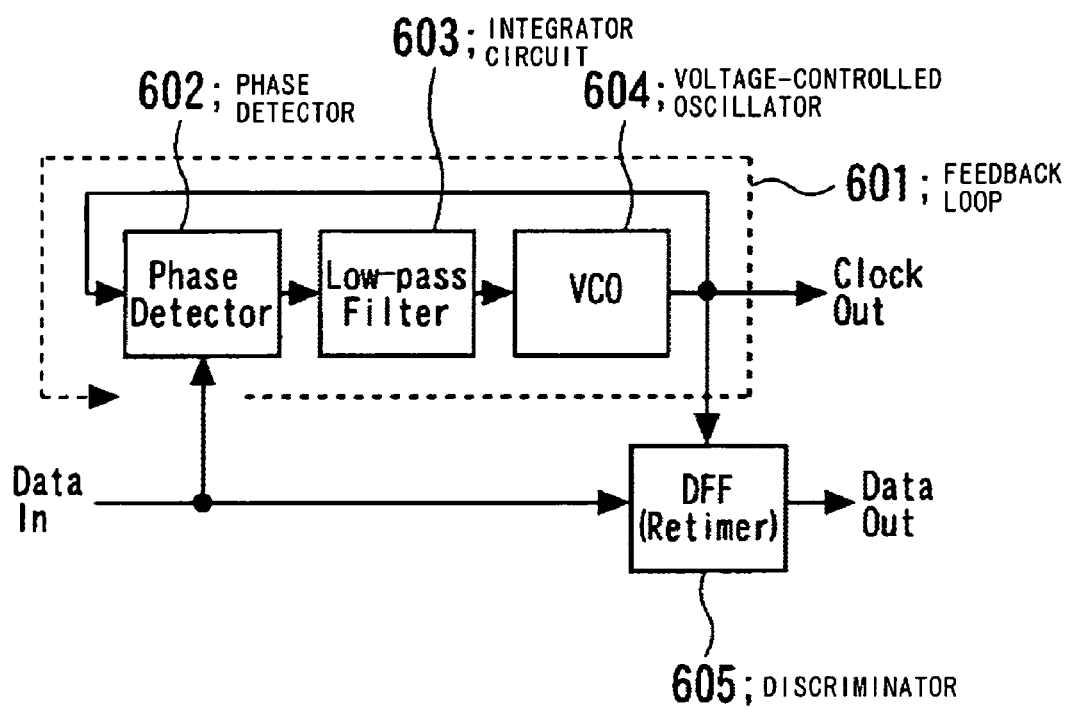
FIG. 8 is a diagram showing a conventional clock and data recovery circuit.

Thus, unlike the case of setting the time constant of the integrator circuit (low-pass filter) of the conventional clock and data recovery circuit, shown in FIGS. 7A and 7B, the time constant of the first integrator circuit (LPF1) 110 can be set so as to be longer, while that of the second integrator circuit (LPF2) 112 can be set so as to be shorter, as shown in FIG. 7C. Meanwhile, FIG. 7 comparatively and schematically shows the time constant of an integrator circuit and an integrated output voltage of the VCO control signal in the conventional circuit and the present invention.

Referring to FIG. 5, the operation of the present embodiment will be described. FIGS. 5A to 5C are timing charts schematically showing the timing operation in case wherein a received data signal has newly been changed after the clock data recovering operation in the embodiment shown in FIG. 1.

Initially, the case wherein there is phase lead in the received data signal will be described with reference to FIG. 5A. In FIG. 5A, the phase of the received data signal leads that of the clock for discrimination by φ.

In this case, the first phase detector 109 compares the change-point of the received data signal with the fall timing of the clock for discrimination, and outputs a value corresponding to the phase difference. In the present embodiment, since the time constant of the first integrator circuit 110 is of a sufficiently large value, the output voltage of the integrator circuit 110 initially is scarcely changed, and hence the oscillation frequency of the VCO 103 also is not changed.

On the other hand, the second integrator circuit 111 also compares the change-point of the received data signal with the change-point of the data output following the discrimination (output of the discriminator 105) and outputs a value corresponding to the phase difference. Since the time constant of the second integrator circuit 112 in the second feedback loop 107 in this case is shorter than the time constant of the first integrator circuit 110, the output integrated value is changed and, initially, the delay value of the phase shifter 108 is shifted towards an optimum value.

Thus, in the present embodiment, the discrimination and recovery of data which is synchronized and correct may be achieved with fast tracking time, such that clock recovery may be achieved within a smaller time than is possible with the aforementioned conventional clock and data recovery circuit.

As time elapses, the oscillation frequency of the VCO 103 is also changed in accordance with slow change of the output integrated value of the first integrator circuit 110.

With the present embodiment, since the second feedback loop 107 at all times optimizes the delay more promptly, correct data and the synchronized state of clock recovery may be maintained until such time that the two feedback loops 104 and 107 transition to a stabilized synchronized state.

FIG. 5B shows the case wherein there is phase lag in the received data signal. In FIG. 5B, the phase of the received data signal lags the phase of the clock for discrimination by φ. In this case, the clock and data recovery circuit reaches its stabilized state within a shorter tracking time in a manner described previously.

FIG. 5C shows the case wherein there is no change in the phase of the received data signal. In this case, the integrator circuit 110 of the first feedback loop 104 is of the time constant sufficiently long as compared with the fundamental frequency of the received data signal. Hence, the integrator circuit 110 outputs a stabilized integrated value even on occurrence of a succession of the same symbols, so that the clock signal from the VCO 103 is of stabilized frequency characteristics with only little jitter or phase noise.

On the other hand, the second feedback loop 107 compares the phase of the received data signal 101 with that of the data signal following the discrimination and recovery. Thus, the clock signal for discrimination may automatically be adjusted by the phase shifter 108 to an optimum delay value with respect to the received data signal.

With the present embodiment, both the stability against occurrence of a succession of the same symbols and the improved response speed both may be achieved in combination. Moreover, the phase delay, which yields an optimum clock signal, may be adjusted automatically.

Figure 2:
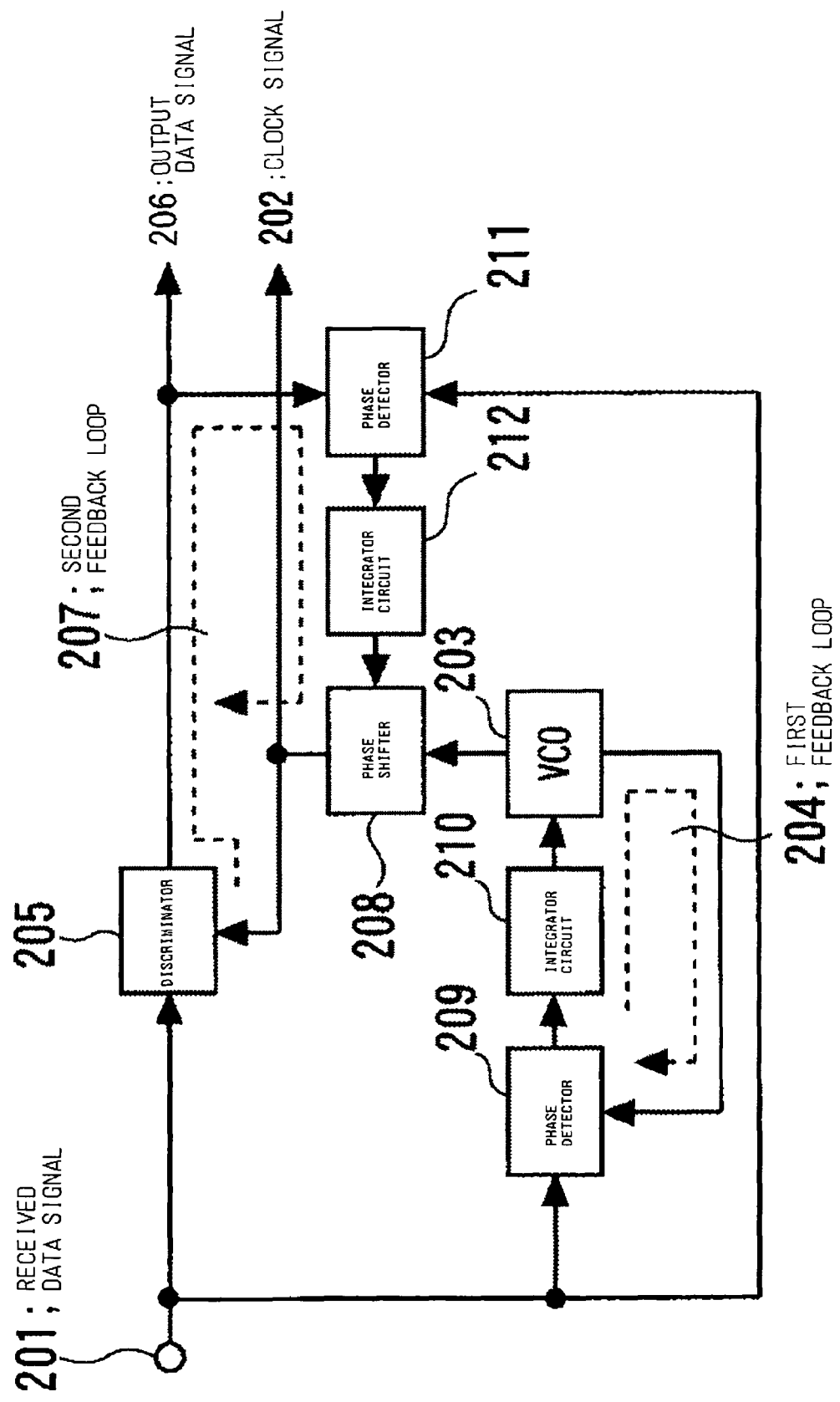
FIG. 2 is a diagram showing the configuration of a second embodiment of the present invention.

FIG. 2 shows the configuration of a second embodiment of the present invention. Referring to FIG. 2, the clock and data recovery circuit of the present embodiment includes a first feedback loop 204 made up by a VCO 203, a first phase detector circuit 209 for detecting the phase difference between the received data signal 201 and a VCO output, and a first integrator circuit 210. The clock and data recovery circuit of the present embodiment includes a second feedback loop 207 made up by a second phase detector circuit 211 which detects the phase difference between a signal corresponding to the received data 201 discriminated by the discriminator 205, and the received data signal 201, a second integrator circuit 212 provided with a charge pump, and a phase shifter 208. The first phase detector circuit 209 is composed by an Ex-OR having a characteristic shown in FIG. 9.

The phase detector circuit 211 is made up by a phase-frequency comparator, while the phase shifter 208 is formed by a vector synthesizing type phase-shift unit.

In the present embodiment, the first feedback loop 204 for controlling the oscillation frequency of the VCO 203 and the second feedback loop 207 for data recovery are disunited each other, so that the oscillation frequency and the phase of the VCO 203 may be controlled independently of each other. Thus, unlike the case of setting the time constant of the conventional integrator circuit, the time constant of the first integrator circuit 210 and that of the second integrator circuit 212 can be set so as to be larger and smaller, respectively, as shown in FIG. 7C.

The operation of the present embodiment will now be described with reference to FIG. 5. The case wherein there is phase lead in the received data signal will be described with reference to FIG. 5A. As in the previous embodiment, the first phase detector circuit 209 compares a change-point of the received data signal to the fall timing of the clock for discrimination (=output of the VCO 203) to output a value corresponding to the phase difference. Since the time constant of the first integrator circuit 210 is of a sufficiently large value, the integrated value is scarcely changed at the outset, and hence the oscillation frequency of the VCO 203 is also not changed. On the other hand, the second phase detector circuit 211 compares the change-point of the received data signal to the change-point of the data output following the discrimination, and outputs a pulse corresponding to a value of the phase difference. If, in this case, the time constant of the second integrator circuit 212 in the second feedback loop 207 is set so as to be smaller than that of the first integrator circuit 210, the output integrated value responds promptly, so that the delay value of the phase shifter 208 at first transitions to its optimum value. As time elapses further on, the oscillation frequency of the VCO 203 is also changed, responsive to the slow change of the output integrated value of the first integrator circuit 210. Since the second feedback loop 207 at all times optimizes the delay more promptly, the correct synchronized state between the data and clock recovery is maintained. The two feedback loops 204 and 207 are before long synchronized to transition to the stabilized state.

In case wherein there is phase lag in the received data signal, the stabilized operation is achieved with a shorter tracking time, as described in connection with the previous embodiment with reference to FIG. 5B.

Moreover, in case wherein there is no change in the phase of the received data signal, the time constant of the first integrator circuit 210 of the first feedback loop 204 is of a sufficiently large value as compared with the fundamental frequency of the received data signal, so that, even for a signal containing a succession of the same symbols, the first integrator circuit of the first feedback loop outputs a stabilized integrated value, as shown in FIG. 5C.

Consequently, the clock signal from the VCO 203 is of a stabilized frequency characteristic having only little jitter or phase noise. On the other hand, the second feedback loop 207 compares the phase of the received data signal 201 with that of the data signal following the discrimination/recovery. If, in this case, there occurs a succession of the same symbols in the signal, the previous value of the integrated output is maintained as a control voltage for the phase shifter 208, due to the configuration of the second phase detector circuit 211, second integrator circuit 212 provided with a charge pump, and the phase shifter 208. Hence, the time constants of the first and second feedback loops 204 and 207 can be set independently of each other.

On the other hand, the clock signal for discrimination has automatically been adjusted by the phase shifter 208 to an optimum delay value with respect to the received data signal 201.

Thus, with the second embodiment of the present invention, unlike the above-described conventional clock data circuit, the stabilized operation for a signal containing a succession of the same symbols and the improved response speed may be achieved in combination. In addition, the phase delay, which will provide an optimum clock signal, may be adjusted automatically.

Figure 3:
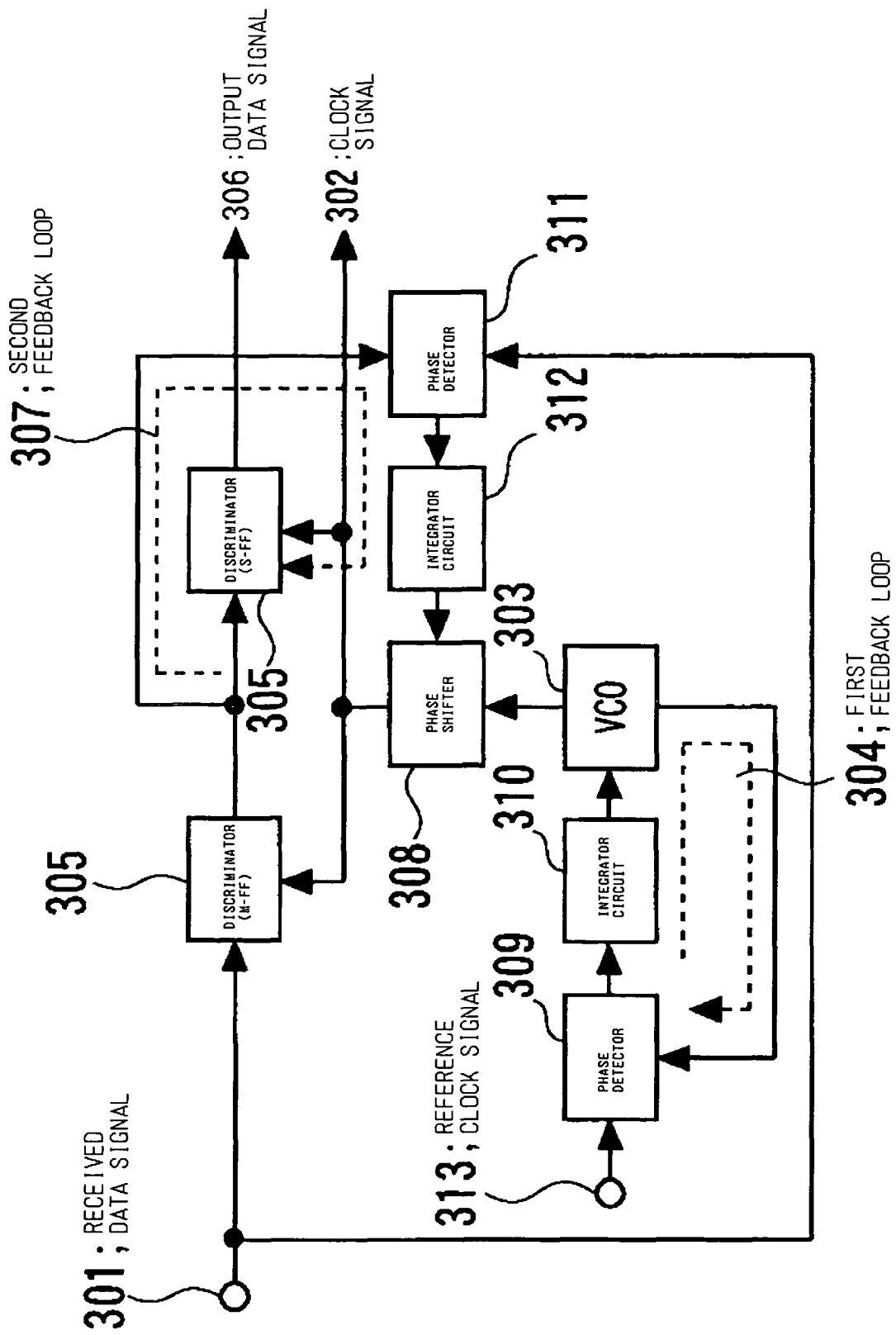
FIG. 3 is a diagram showing the configuration of a third embodiment of the present invention.

FIG. 3 shows the configuration of a third embodiment of the present invention. Referring to FIG. 3, the clock and data recovery circuit of the present embodiment includes a VCO 303, a first phase detector circuit 309 which detects the phase difference between a reference clock signal 313 and an output of the VCO 303, and a first integrator circuit (LPF1) 310, forming a first loop filter (LPF). The clock and data recovery circuit also includes a second feedback loop 307, made up by a discriminator 305, a second phase detector circuit 311 which detects the phase difference between a signal obtained on discrimination of received data 301 by the discriminator 305 and the received data 301, a second integrator circuit (LPF2) 312, and a phase shifter 308.

The first phase detector circuit 309 and the second phase detector circuit 311 are each formed by an Ex-OR having a characteristic shown in FIG. 9. The phase shifter 308 is formed by a reflection type phase-shifter shown in FIG. 6.

In the present embodiment, a first feedback loop 304, controlling the oscillation frequency of the VCO 303 by the reference clock signal 313, and the second feedback loop 307 for data recovery are disunited. Hence, the normal operation of data discrimination and recovery may be carried out as the VCO 303 is kept synchronized with the reference clock signal 313 supplied to the clock and data recovery circuit.

With the present embodiment, in which the time constants of the first and second integrator circuits are set so as to be larger and smaller, respectively, the clock signal recovered in a stabilized state and the significantly improved response speed may be achieved simultaneously.

Figure 4:
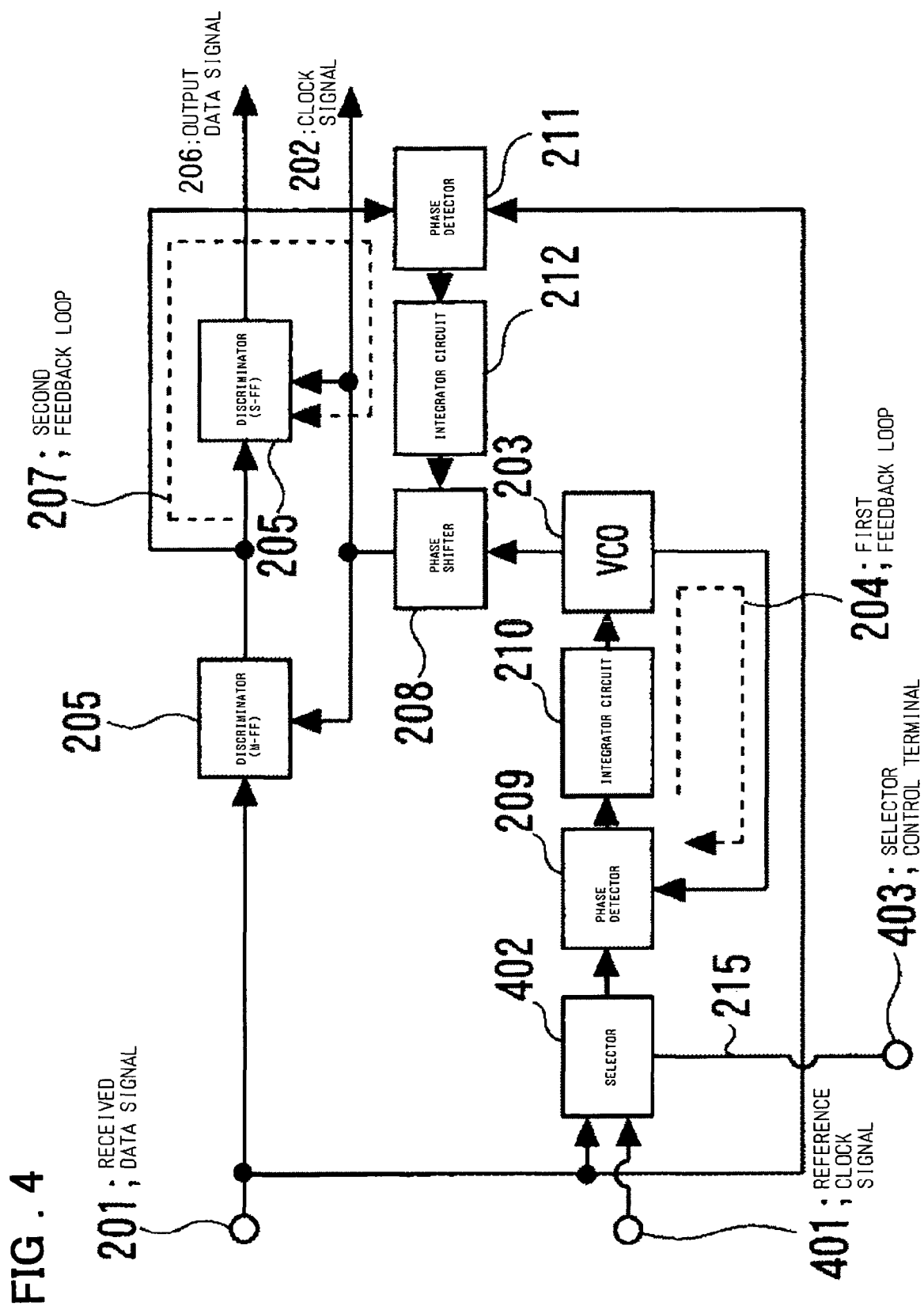
FIG. 4 is a diagram showing the configuration of a third embodiment of the present invention.

FIG. 4 shows the configuration of a fourth embodiment of the present invention. Referring to FIG. 4, a clock and data recovery circuit of the present embodiment includes a first feedback loop 204, made up by a VCO 203, a selector circuit 402 which switches between a reference clock signal 401 and a received data signal 201, based on a signal on a selector control terminal 403, a first phase detector circuit 209 which detects the phase difference between an output signal of the selector circuit 402 and the clock signal output from the VCO 203, and by a first integrator circuit (LPF1) 210. The clock and data recovery circuit also includes a second feedback loop 207, made up by a discriminator 205, a second phase detector circuit 211 which detects the phase difference between a signal obtained by discriminating the received data 201 by the discriminator 205 and the received data 201, a second integrator circuit (LPF2) 212, and by a phase shifter 208.

The first phase detector circuit 209 and the second phase detector circuit 211 are each formed by an Ex-OR having a characteristic shown in FIG. 9. The phase shifter 208 is formed by a reflection phase-shifting unit shown in FIG. 6.

In the present embodiment, the first feedback loop 204, controlling the oscillation frequency of the VCO by phase comparison between the output signal of the selector circuit 402 and the output signal of the VCO 203, and the second feedback loop 207 for data recovery are disunited.

With the VCO 203, the normal operation of data discrimination and recovery may be performed as the VCO is kept synchronized with the reference clock signal 401.

Moreover, with the present embodiment, the reference clock signal 401 may be synchronized with the VCO 203 when the received data signal is off-line, and a selector control signal 215 may be changed over when the received data signal is on-line, such as to permit the selector circuit 402 to select the received data signal 201. This allows phase synchronization of the clock signal from the VCO 203 with the received data signal 201.

With the present embodiment, the lock-in time (time until synchronization pull-in) of the clock and data recovery circuit may be reduced significantly. Moreover, with the present embodiment, the response time to variations in the data signal may be made shorter by setting the time constant of the second feedback loop 207 to a smaller value.

Thus, with the present embodiment, it is possible to realize faster lock-in, a stabilized recovered clock signal and quick response time simultaneously.

Although the present invention has so far been described with reference to the preferred embodiments, the present invention is not limited to the particular configurations of these embodiments. It will be appreciated that the present invention may encompass various changes or corrections such as may readily be arrived at by those skilled in the art within the scope and the principle of the invention.

INDUSTRIAL APPLICABILITY

The clock and data recovery circuit according to the present invention may be used in an interfacing circuit, a semiconductor device, an electronic device or an information communication system including the clock recovery function for discriminating and recovering a data signal from an input data signal.

What is claimed is:
1. A clock and data recovery circuit comprising:
a phase synchronization loop including:
an oscillator outputting a clock signal, a frequency of which is variably controlled based on a control signal supplied thereto;
a first phase detector detecting a phase difference between said clock signal output from said oscillator and a received data signal; and
a first integrator integrating an output from said first phase detector to supply an integrated signal to said oscillator as said control signal;
a discriminator circuit, responsive to a discrimination clock signal, discriminating said received data signal and outputting a discriminated data signal;
a second phase detector circuit detecting a phase difference between said discriminated data signal, discriminated and output by said discriminator circuit, and said received data signal;
a second integrator integrating a comparison result output from said second phase detector circuit; and
a phase shift circuit shifting a phase of said clock signal, output from said oscillator, based on an integrated signal from second integrator, to produce said discrimination clock signal
supplied to said discriminator circuit,
wherein said discriminator circuit, said second phase detector circuit, said second integrator and said phase shift circuit comprise a feedback loop separate from said phase synchronization loop.

2. A clock and data recovery circuit comprising:
a first feedback loop at least including:
a voltage-controlled oscillator circuit varying an oscillation frequency based on a control signal voltage supplied thereto;
a first phase detector circuit supplied with a clock signal output from said voltage-controlled oscillator circuit and with a received data signal to detect a phase difference between said clock signal and said received data signal; and
a first integrator circuit integrating an output of said first phase detector circuit to supply an integrated signal to said voltage-controlled oscillator circuit as said control signal voltage; and
a second feedback loop including:
a discriminator circuit supplied with said received data signal, said discriminator circuit discriminating said received data signal, responsive to a discrimination clock signal supplied thereto; and
a second phase detector circuit supplied with an output data signal discriminated and output by said discriminator circuit and with said received data signal to detect a phase difference between said two signals supplied; and
a second integrator circuit integrating an output of said second phase detector circuit; and
a phase shift circuit supplied with said clock signal output from said voltage-controlled oscillator circuit and with an integrated signal output from said second integrator circuit, said phase shift circuit shifting a phase of said clock signal supplied in accordance with said integrated signal output from said second integrator circuit, to output a resulting clock signal;
said clock signal output from said phase shift circuit being supplied to said discriminator circuit, as said discrimination clock signal and being output as an output clock signal.

3. The clock and data recovery circuit according to claim 2, wherein a time constant of said first feedback loop is selected to be larger than a time constant of said second feedback loop.

4. The clock and data recovery circuit according to claim 2, wherein said first phase detector circuit compares a phase of said received data signal supplied to a first input end thereof with that of said clock signal supplied to a second input end thereof from said voltage-controlled oscillator circuit to output a comparison result at an output end thereof;
said first integrator circuit is supplied with an output signal from said first phase detector circuit to integrate the signal supplied;
said voltage-controlled oscillator circuit is supplied with an output signal of said first integrator circuit at an input end thereof to change said oscillation frequency based on an output signal from said first integrator circuit to output a resulting clock signal at an output end thereof;
said clock signal, output from said voltage-controlled oscillator circuit is fed back to a second input end of said first phase detector circuit,
said discriminator circuit is supplied with said received data signal at a data input end thereof to discriminate said received data signal based on said discrimination clock signal supplied to a clock input terminal thereof to output a data signal at an output end thereof;
said second phase detector circuit compares a phase of said output data signal supplied to a first input end thereof from said discriminator circuit with that of said received data signal supplied to a second input end thereof to output a comparison result at an output end thereof;

said second integrator circuit is supplied with an output signal from said second phase detector circuit to integrate said signal supplied;

said phase shift circuit is supplied with said clock signal output from said voltage-controlled oscillator circuit at an input end thereof and with an integrated signal output from said second integrator circuit at a control signal input end thereof to shift a phase of said clock signal output from said voltage-controlled oscillator circuit, based on said integrated signal output from said second integrator circuit, to output a resulting discrimination clock signal at an output end thereof; and said discrimination clock signal output from said phase shift circuit is supplied to said discriminator circuit.

5. A clock and data recovery circuit comprising:

a first feedback loop including:

a voltage-controlled oscillator circuit varying an oscillation frequency based on a control signal voltage supplied thereto;

a first phase detector circuit receiving a clock signal output from said voltage-controlled oscillator circuit and a reference clock signal to detect a phase difference therebetween; and a first integrator circuit integrating an output of said first phase detector circuit to supply an integrated signal to said voltage-controlled oscillator circuit as a control signal voltage; and a second feedback loop including:

a discriminator circuit supplied with a received data signal, said discriminator circuit discriminating said received data signal, responsive to a discrimination clock signal supplied thereto;

a second phase detector circuit supplied with an output data signal discriminated and output by said discriminator circuit and with said received data signal to detect a phase difference between said two signals supplied a second integrator circuit integrating an output of said second phase detector circuit; and a phase shift circuit supplied with said clock signal output from said voltage-controlled oscillator circuit and with an integrated signal output from said second integrator circuit, said phase shift circuit shifting a phase of said clock signal supplied in accordance with said integrated signal output from said second integrator circuit, to output a resulting clock signal;

said clock signal output from said phase shift circuit being supplied to said discriminator circuit, as said discrimination clock signal and being output as an output clock signal.

6. The clock and data recovery circuit according to claim 5, wherein said first feedback loop includes:

a selection circuit supplied with said reference clock signal and with said received data signal to output one of said signals, based on a selection control signal supplied thereto;

and wherein said first phase detector circuit is supplied with said clock signal output from said voltage-controlled oscillator circuit and with a signal output from said selection circuit to detect a phase difference therebetween.

7. The clock and data recovery circuit according to claim 5, wherein a time constant of said first feedback loop is selected to be larger than a time constant of said second feedback loop.

* * * * *